(12) United States Patent
Zhang (10) Patent No.: US 12,150,257 B2
(45) Date of Patent: Nov. 19, 2024

(54) FOLDABLE DISPLAY DEVICE

(71) Applicant: HUIZHOU CHINA STAR OPTOELECTRONICS DISPLAY CO., LTD., Huizhou (CN)

(72) Inventor: Jianji Zhang, Huizhou (CN)

(73) Assignee: HUIZHOU CHINA STAR OPTOELECTRONICS DISPLAY CO., LTD., Huizhou (CN)

( * ) Notice: Subject to any disclaimer, the term of this patent is extended or adjusted under 35 U.S.C. 154(b) by 260 days.

(21) Appl. No.: 17/790,256

(22) PCT Filed: Jun. 29, 2022

(86) PCT No.: PCT/CN2022/102354
§ 371 (c)(1),
(2) Date: Jun. 30, 2022

(87) PCT Pub. No.: WO2023/245707
PCT Pub. Date: Dec. 28, 2023

(65) Prior Publication Data
US 2023/0413455 A1 Dec. 21, 2023

(30) Foreign Application Priority Data
Jun. 21, 2022 (CN) .......................... 202210709083.6

(51) Int. Cl.
*H05K 5/00* (2006.01)
*H05K 5/03* (2006.01)
(52) U.S. Cl.
CPC ............. *H05K 5/0018* (2022.08); *H05K 5/03* (2013.01)
(58) Field of Classification Search
CPC .......................... H05K 5/0017; H05K 5/0217

USPC ......................................................... 361/807
See application file for complete search history.

(56) References Cited

U.S. PATENT DOCUMENTS

| 2005/0110702 A1 | 5/2005 | Aoki et al. |
| 2011/0011999 A1 | 1/2011 | Wischkin |
| 2019/0380217 A1* | 12/2019 | Cosgrove ............. H05K 5/0208 |

FOREIGN PATENT DOCUMENTS

| CN | 107048635 A | 8/2017 |
| CN | 206757270 U | 12/2017 |
| CN | 108064136 A | 5/2018 |
| CN | 212365385 U | 1/2021 |
| CN | 113628542 A | 11/2021 |
| CN | 215494816 U | 1/2022 |
| CN | 114078386 A | 2/2022 |
| JP | 2007271651 A | 10/2007 |
| JP | 2008058903 A | 3/2008 |

(Continued)

OTHER PUBLICATIONS

Chinese Office Action issued in corresponding Chinese Patent Application No. 202210709083.6 dated Mar. 31, 2023, pp. 1-14, 37pp.

(Continued)

*Primary Examiner* — Hung S. Bui
(74) *Attorney, Agent, or Firm* — The Roy Gross Law Firm, LLC; Roy Gross (57) ABSTRACT

The present provides a foldable display device. When the foldable display device folds, the foldable display device is in an umbrella-like the folding state to reduce a size of the foldable display device in the folding state, which has an advantage of convenience of carrying.

20 Claims, 9 Drawing Sheets

(56) References Cited

FOREIGN PATENT DOCUMENTS

KR     20150015684 A    2/2015
WO     2017124118 A1    7/2017

OTHER PUBLICATIONS

PCT International Search Report for International Application No. PCT/CN2022/102354, mailed on Dec. 19, 2022, 10pp.
PCT Written Opinion of the International Search Authority for International Application No. PCT/CN2022/102354, mailed on Dec. 19, 2022, 8pp.

* cited by examiner

FOLDABLE DISPLAY DEVICE

This application is a National Phase of PCT Patent Application No. PCT/CN2022/102354 having International filing date of Jun. 29, 2022, which claims the benefit of priority of Chinese Patent Application No. 202210709083.6, filed Jun. 21, 2022, the contents of which are all incorporated herein by reference in their entirety.

FIELD OF INVENTION

The present application relates to a field of display technologies, especially to a foldable display device.

BACKGROUND OF INVENTION

In recently years, organic light emitting diode display technology has been applied extensively. Because a flexible organic light emitting diode display device has excellent flexibility, applications of folding display devices thereof increase. At present, a foldable display device has a single folding axis or two parallel folding axes, foldable display device has a great size in a folding state.

Therefore, it is necessary to set forth a technical solution solve an issue of the foldable display device having a greater size in the folding state.

SUMMARY OF INVENTION

Technical Issue

An objective of the present application is to provide a foldable display device that reduces a size of a foldable display device in a folding state.

Technical Solution

A foldable display device, the foldable display device comprising:
- a flexible display module, wherein the flexible display module comprises a folding region and a plurality of non-folding regions, the folding region comprises a first folding region, a plurality of second folding regions and a plurality of third folding regions, the second folding regions are connected to one of the first folding region along a radial direction of one of the first folding region, the third folding regions is located between adjacent two of the second folding regions and is connected to one of the first folding region, and each of the non-folding regions is disposed between one of the second folding regions and one of the third folding regions that are adjacent to each other;
- a hinge mount located on a rear side of a light exiting surface of the flexible display module and connected to a portion of the flexible display module corresponding to the first folding region; and
- a plurality of support bars located on the rear side of the light exiting surface of the flexible display module, articulated on the hinge mount along a radial direction of the hinge mount, and connected to portions of the flexible display module corresponding to the second folding regions, wherein the support bars are configured to rotate to drive the flexible display module to stretch or fold.

In the above foldable display device, the flexible display module comprises:
- a flexible display panel; and
- a protective cover lid located on a light exiting side of the flexible display panel, wherein the protective cover lid comprises recesses located in the folding region.

In the above foldable display device, the recesses are defined in a surface of the protective cover lid away from the flexible display panel, and the flexible display module further comprises:
- a filling layer, wherein at least a portion of the filling layer is filled in the recesses of the protective cover lid, and an elastic modulus of the filling layer is less than an elastic modulus of the protective cover lid.

In the above foldable display device, a ratio of a refractive index of the filling layer to a refractive index of the protective cover lid is greater than or equal to 0.9 and is less than or equal to 1.1.

In the above foldable display device, the foldable display device further comprises:
- a rigid support element disposed on the rear side of the light exiting surface of the flexible display module and is located in the non-folding regions.

In the above foldable display device, the foldable display device further comprises a bonding element, when the foldable display device is in a stretching state, and the bonding element is bonded to a surface of the rigid support element away from the flexible display module.

In the above foldable display device, the first folding region is located at a center position of the flexible display module, one of the third folding regions is disposed in adjacent two of the second folding regions, and adjacent two of the second folding regions are axial-symmetrically disposed relative to the third folding regions.

In the above foldable display device, when the foldable display device switches from a stretching state to a folding state, a rotational angle of the support bars is greater than 0 degree and is less than or equal to 90 degrees.

In the above foldable display device, the hinge mount comprises:
- a plurality of aperture slots located at an end of the hinge mount and are defined along a radial direction of the hinge mount, wherein each of the aperture slots comprises a bottom surface and a side surface connected to the bottom surface, and the side surface is disposed opposite to an aperture of the aperture slot; and
- a plurality of protrusion connection elements disposed on the bottom surfaces of the aperture slots and are disposed opposite to the side surfaces at intervals, wherein the protrusion connection elements is articulated to the support bars;
- wherein when the foldable display device is in a stretching state, an end of the support bar articulated to the protrusion connection element abuts the side surface of the aperture slot;
- wherein when the foldable display device is in a completely folding state, the end of the support bar articulated to the protrusion connection element abuts the bottom surface of the aperture slot.

In the above foldable display device, the side surface extends along a radial direction of the hinge mount, and the side surface is perpendicular to the bottom surface.

In the above foldable display device, the foldable display device is an outer folding display device, and the aperture slots are located at an end of the hinge mount away from the flexible display module.

In the above foldable display device, the foldable display device further comprises:
- a slide bar connected to the hinge mount;
- a slide collar sleeved on the slide bar; and a plurality of connection bars, two opposite ends of the connection bars are articulated to the slide collar and the support bars respectively.

In the above foldable display device, the slide bar comprises:

a first slide bar securely connected to the hinge mount; and a second slide bar rotatably connected to the first slide bar.

In the above foldable display device, the foldable display device is an inner folding display device, and the aperture slots are located at an end of the hinge mount near the flexible display module.

In the above foldable display device, the flexible display module comprises the light exiting surface and a rear surface disposed opposite to the light exiting surface, when the flexible display module is in a completely folding state, the flexible display module folds along the first folding region, the second folding regions, and the third folding regions; and the foldable display device is an inner folding display device, and the light exiting surfaces of two of the non-folding regions adjacent to two opposite sides of one of the third folding regions contact each other; or the foldable display device is an outer folding display device, and rear surfaces of two of the non-folding regions adjacent to two opposite sides of one of the third folding regions contact each other.

In the above foldable display device, the folding region further comprises a plurality of fourth folding regions, one of the fourth folding regions extends from the third folding regions and is disposed at an interval from the second folding regions, one of the fourth folding regions is located between adjacent two of the non-folding regions, two opposite sides of each of the third folding regions are symmetrically located adjacent to at least two of the fourth folding regions, when the flexible display module is in the completely folding state, the fourth folding regions of the flexible display module fold along the radial direction of the hinge mount; and;

the foldable display device is an inner folding display device, and the light exiting surfaces of two of the non-folding regions adjacent to two opposite sides of one of the third folding regions contact each other, and contact a rear surface of one of the non-folding regions adjacent to one of the fourth folding regions and contact a rear surface of another of the non-folding regions adjacent to another of the fourth folding regions.

Advantages the present application provides a foldable display device, flexible display module comprises a folding region and a plurality of non-folding regions. The folding region comprises a first folding region, a plurality of second folding regions and a plurality of third folding regions. The second folding regions is located adjacent to one first folding region along a radial direction of the first folding region. The third folding region is located between adjacent two of the second folding regions and is located adjacent to one first folding region. The non-folding regions are disposed between adjacent ones of the second folding regions and the third folding regions. A hinge mount is located on a rear side of a light exiting surface of the flexible display module, and the hinge mount is connected to a portion of the flexible display module corresponding to the first folding region. A plurality of support bars are located on the rear side of the light exiting surface of the flexible display module, a plurality of support bars are articulated to the hinge mount along the radial direction of the hinge mount, and the support bars are connected to portions of the flexible display module corresponding to second folding regions. The support bars to drive the flexible display module to stretch or fold. When the foldable display device folds, the foldable display device is in a umbrella-like folding state to reduce a size of the foldable display device in the folding state and has an advantage of convenience for carrying.

DETAILED DESCRIPTION OF PREFERRED EMBODIMENTS

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application.

Figure 1:
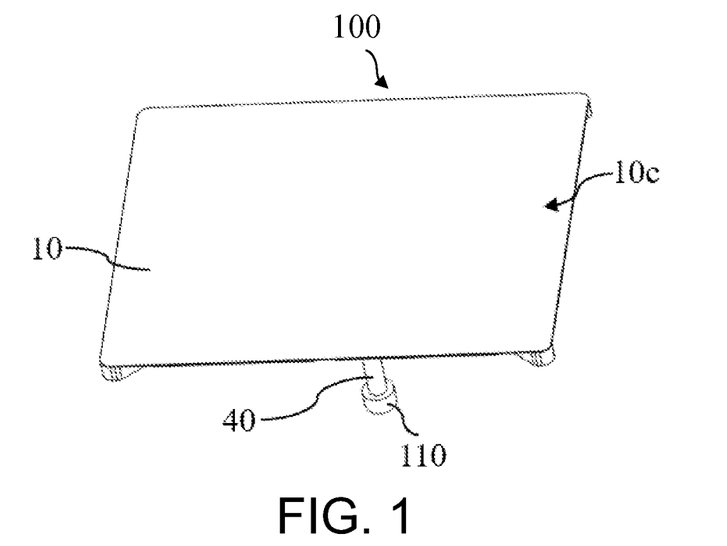
FIG. 1 is a schematic perspective view of an viewing angle of a foldable display device of an embodiment of the present application in a stretching state.
Figure 2:
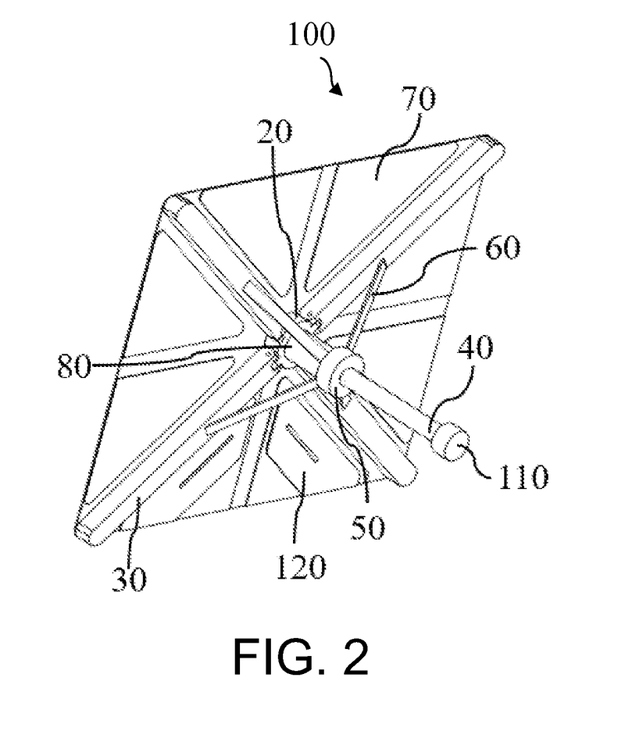
FIG. 2 is a schematic perspective view of another viewing angle of the foldable display device shown in FIG. 1 in the stretching state.
Figure 3:
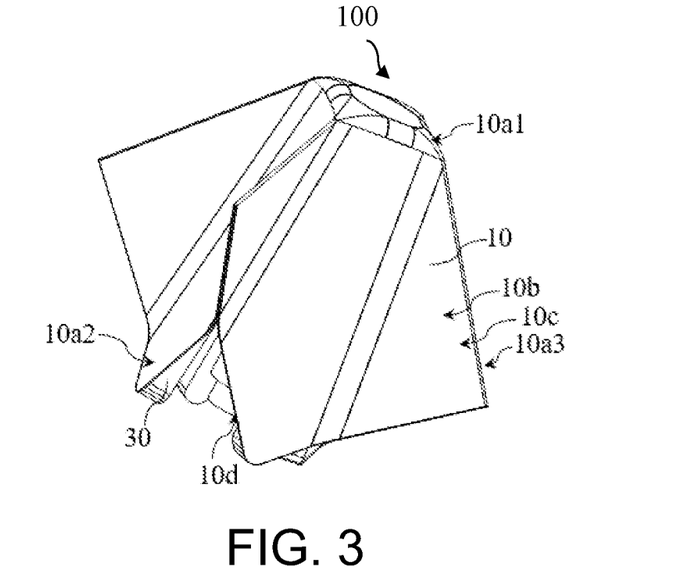
FIG. 3 is a schematic perspective view of the foldable display device shown in FIG. 1 is in a completely folding state.

With reference to FIGS. 1, 2, and 3, the present application provides a foldable display device, the foldable display device is an outer folding display device. The foldable display device 100 comprises a flexible display module 10, a hinge mount 20, a plurality of support bars 30, a slide bar 40, a slide collar 50, a plurality of connection bars 60, and a rigid support element 70.

Figure 4:
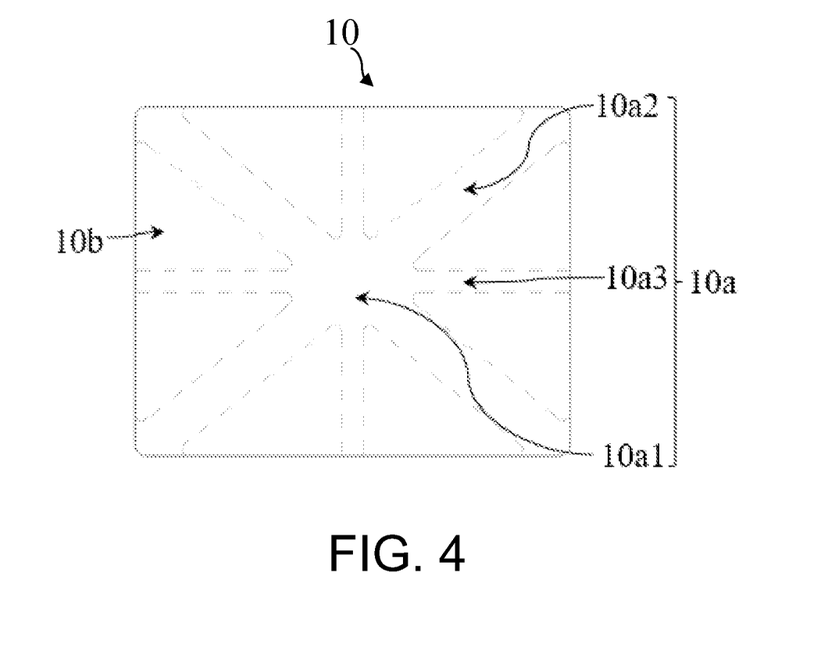
FIG. 4 is a schematic plan view of a flexible display module of the foldable display device shown in FIG. 1.

With reference to FIG. 4, the flexible display module 10 comprises a plurality of folding regions 10a and a plurality of non-folding regions the folding regions 10a comprises a first folding region 10a1, a plurality of second folding regions 10a2, and a plurality of third folding regions 10a3.

The flexible display module 10 can be rectangle, circle, square or other irregular pattern.

The hinge mount 20 is disposed in the first folding region 10a1. When the foldable display device 100 switches between a stretching state and a folding state, the first folding region 10a1 deforms. A number of the first folding region 10a1 is one. The first folding region 10a1 is located at a center position of the flexible display module 10. A shape of the first folding region 10a1 is circle, rectangle, square, ellipse or irregular shape.

It can be understood that the first folding region 10a1 can also be not located at the center position of the flexible display module 10.

The second folding regions 10a2 is configured to dispose the support bars 30. When the foldable display device 100 switches between the stretching state and the folding state, the second folding regions 10a2 deform.

The second folding regions 10a2 are radially adjacent to an outer periphery of one of the first folding region 10a1. The second folding region 10a2 is located adjacent to one of the first folding region 10a1 along a radial direction (perimeter direction) of one of the first folding region 10a1. The second folding regions 10a2 are stripe-like.

When the foldable display device 100 switches between the stretching state and the folding state, the third folding regions 10a3 deform, and the foldable display device 100 deforms along the third folding regions 10a3.

The third folding regions 10a3 are also radially adjacent to the outer periphery of one of the first folding region 10a1. The third folding region 10a3 is located between adjacent two of the second folding regions 10a2, and adjacent two of the second folding regions 10a2 are symmetrically disposed relative to one of the third folding regions 10a3. The third folding regions 10a3 are also stripe-like.

A width of the third folding regions 10a3 is less than a width of the second folding regions 10a2. The width of the third folding regions 10a3 is perpendicular to an extension direction of the third folding regions 10a3. The width of the second folding regions 10a2 is perpendicular to an extension direction of the second folding regions 10a2.

It can be understood that the width of the third folding regions 10a3 can also be greater than or equal to is less than the width of the second folding regions 10a2.

at least one of the non-folding regions 10b is disposed between adjacent one of the second folding regions 10a2 and adjacent one of the third folding regions 10a3. When one of the non-folding regions 10b is disposed between adjacent one of the second folding regions 10a2 and adjacent one of the third folding regions 10a3, a shape of the non-folding region are determined by the adjacent second folding region 10a2 and third folding region 10a3.

In particular, the flexible display module 10 is a rectangle, one of the first folding region 10a1 is located at center position of the flexible display module 10, four of the second folding regions 10a2 are located on positions of diagonal lines of the flexible display module 10, one of the third folding regions 10a3 is disposed between adjacent two of the second folding regions 10a2, the third folding regions 10a3 is a rectangle. Adjacent two of the second folding regions 10a2 are axial-symmetrically disposed relative to one of the third folding regions 10a3. A shape of the non-folding region 10b between adjacent one of the third folding regions 10a3 and adjacent one of the second folding regions 10a2 is a triangle with a right angle.

It can be understood that positions of the second folding regions 10a2 can be exchanged with positions of the third folding regions 10a3.

Figure 5:
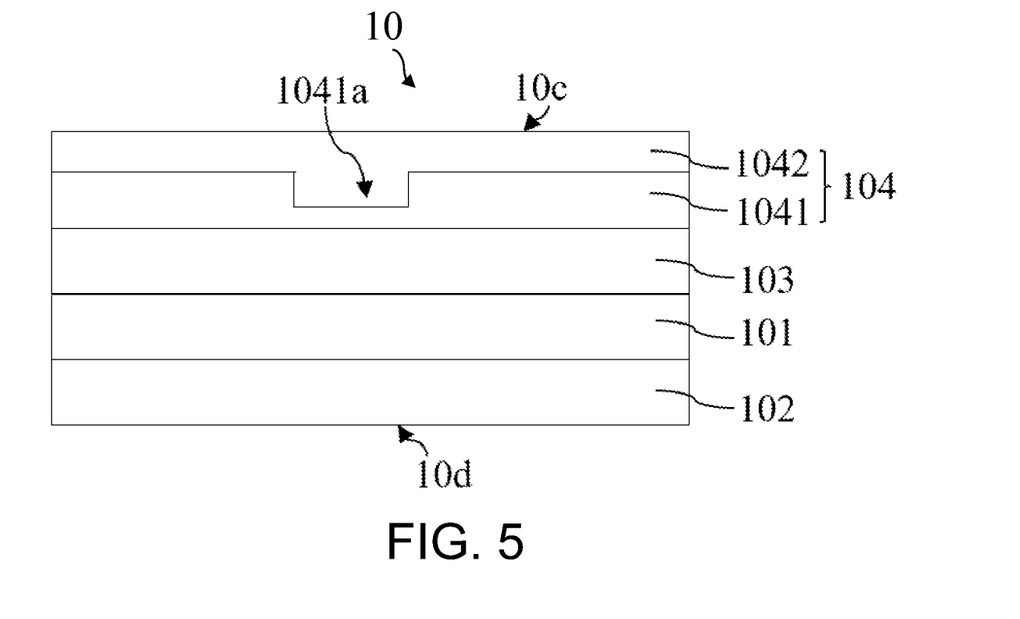
FIG. 5 is a schematic cross-sectional view of the flexible display module of the foldable display device shown in FIG. 1.

With reference to FIGS. 1 and 5, the flexible display module 10 comprises a light exiting surface 10c and a rear surface 10d disposed opposite to the light exiting surface 10c. The flexible display module 10 comprises a backplate 102, a flexible display panel 101, a polarizer 103, and a window 104.

The flexible display panel 101 is configured to emit light, and the flexible display panel 101 is a flexible organic light emitting diode display panel.

The backplate 102 is located on a rear side of a light exiting side of the flexible display panel 101. The backplate 102 is adhere to the flexible display panel 101 through an optical adhesive layer. The backplate 102 is a flexible backplate.

The polarizer 103 is located on the light exiting side of the flexible display panel 101. The polarizer 103 is adhered to the flexible display panel 101 through an optical adhesive layer.

The window 104 is located on the light exiting side of the flexible display panel 101, and the window 104 is located on a side of the polarizer 103 away from the flexible display panel 101. The window 104 is adhered to the polarizer 103 through an optical adhesive layer. The window 104 comprises a protective cover lid 1041 and a filling layer 1042.

Figure 6:
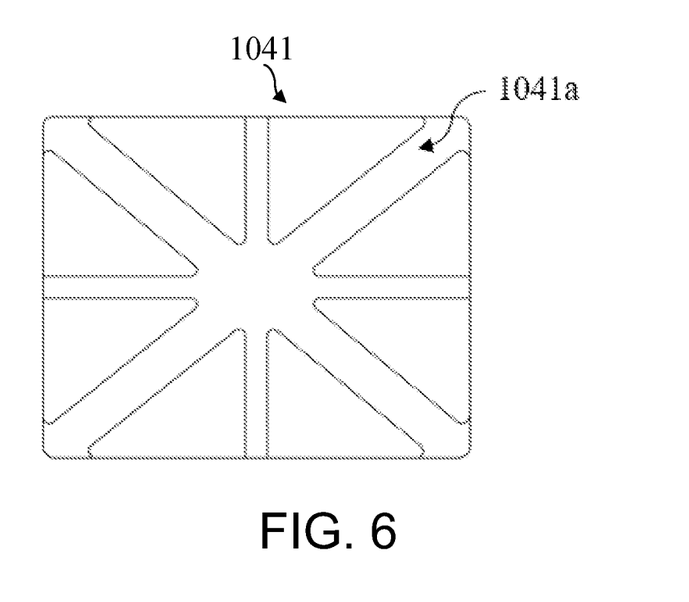
FIG. 6 is a plane schematic view of a protective cover lid of the flexible display module shown in FIG. 5.

With reference to FIGS. 5 and 6, the protective cover lid 1041 comprises recesses 1041a in the folding regions 10a to improve foldability of the folding regions 10a of the protective cover lid 1041.

The recesses 1041a are defined in a surface of the protective cover lid 1041 away from the flexible display panel 101 to reduce difficulty of the protective cover lid 1041 bonded to the polarizer 103.

It should be explained that the recesses 1041a can also be disposed on a surface of the protective cover lid 1041 near the flexible display panel 101. However, defining the recesses 1041a on the surface of the protective cover lid 1041 near the flexible display panel 101 would increase difficulty of the protective cover lid 1041 bonded to the polarizer 103.

Shapes of the recesses 1041a fit shapes of corresponding ones of the first folding region 10a1, the second folding regions 10a2, and the third folding regions 10a3 respectively.

In particular, the shape and size of the recess 1041a overlapping one of the first folding region 10a1 are the same as the shape and size of the first folding region 10a1. The shape and size of the recess 1041a overlapping one of the second folding regions 10a2 are the same as the shape and size of the second folding region 10a2. The shape and size of the recess 1041a overlapping one of the third folding regions 10a3 are the same as the shape and size of the third folding regions 10a3.

A thickness of the protective cover lid 1041 located in the non-folding regions 10b is greater than or equal to 100 microns and is less than or equal to 200 microns. For example, the thickness of the protective cover lid 1041 located in the non-folding regions 10b 120 microns, 140 microns, 160 microns, or 180 microns. A thickness of the protective cover lid 1041 located in the folding regions 10a is greater than or equal to 20 microns and is less than or equal to 50 microns. For example, the thickness of the protective cover lid 1041 located in the folding regions 10a is 25 microns, 30 microns and 40 microns.

The protective cover lid 1041 is ultra-thin glass such that the protective cover lid 1041 has an excellent mechanical capability, surface texture, and wrinkle resistance.

It should be explained that the recesses 1041a in the protective cover lid 1041 are manufactured and obtained by a wet-etching process. Solution of the wet-etching process comprises hydrofluoric acid, ammonium fluoride, ammonium bifluoride, nitric acid and sulfuric acid.

The filling layer 1042 is transparent. At least a portion of the filling layer 1042 is filled in the recesses 1041a of the protective cover lid 1041. An elastic modulus of the filling layer 1042 is less than an elastic modulus of the protective cover lid 1041 to mitigate an issue of visible step difference due to defining the recesses 1041a on the protective cover lid 1041 while guaranteeing excellent foldability of the folding regions 10a of the protective cover lid 1041.

In particular, a portion of the filling layer 1042 is filled in the recesses 1041a of the protective cover lid 1041. Another portion of the filling layer 1042 is located on a surface of the protective cover lid 1041 away from the flexible display panel 101 的. It can be understood that the filling layer 1042 can also be filled in the recesses 1041a.

A ratio of a refractive index of the filling layer 1042 to a refractive index of the protective cover lid 1041 is greater than or equal to 0.9 and is less than or equal to 1.1 such that the refractive index of the filling layer 1042 is similar to the refractive index of the protective cover lid 1041 to further mitigate the issue of the recesses 1041a becoming easily visible after the filling layer 1042 is filled in the recesses 1041a. For example, the ratio of the refractive index of the filling layer 1042 to the refractive index of the protective cover lid 1041 is 0.9, 0.95, 1 or 1.1.

The filling layer 1042 is a polymer coating layer to be filled in the recesses 1041a of the protective cover lid 1041 such that the window 104 has excellent foldability. A material for manufacturing the polymer coating layer is selected from at least one of polyimide, polyurethane, polymethylmethacrylate.

With reference to FIG. 2, the hinge mount 20 is located on the rear side of the light exiting surface 10c of the flexible display module 10. The hinge mount 20 is disposed to correspond to the first folding region 10a1 of the flexible display module 10, and the hinge mount 20 is connected to a portion of the flexible display module 10 corresponding to the first folding region 10a1. The hinge mount 20 is connected to the portion of the flexible display module 10 corresponding to the first folding region 10a1 through a adhesive layer.

Figure 7:
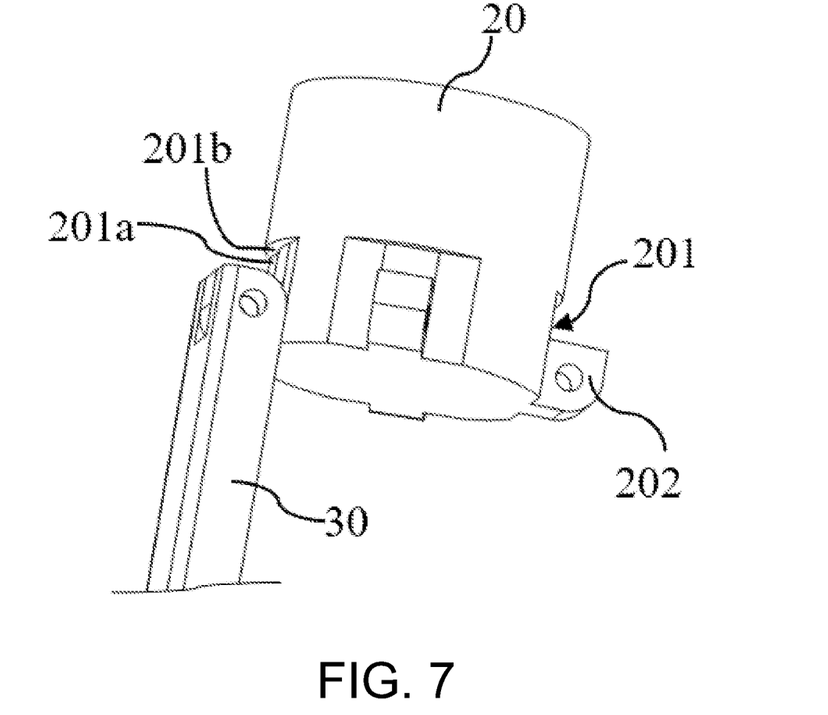
FIG. 7 is a schematic view of a hinge mount articulated to support bars of the foldable display device shown in FIG. 1 in a completely folding state.

With reference to FIG. 7, the hinge mount 20 is cylindrical, the hinge mount 20 comprises a plurality of aperture slots 201 and a plurality of protrusion connection elements 202. A material for manufacturing the hinge mount 20 is plastic or metal.

The aperture slots 201 are located at an end of the hinge mount 20 away from the flexible display module 10 and are defined along the radial direction of the hinge mount 20. The aperture slot 201 comprises a bottom surface 201a and a side surface 201b connected to the bottom surface 201a. The side surface 201b is disposed opposite to an aperture of the aperture slot 201.

The bottom surface 201a extends along an axial direction of the hinge mount 20. The side surface 201b extends along a radial direction of the hinge mount 20. The side surface 201b is perpendicular to the bottom surface 201a. It can be understood that an included angle between the side surface 201b and the bottom surface 201a is less than 90 degrees or is greater than 90 degrees.

One of the protrusion connection elements 202 is disposed in one of the aperture slots 201. The protrusion connection elements 202 are disposed the bottom surface 201a on of the aperture slots 201 and are disposed opposite to the side surface 201b at intervals.

With reference to FIGS. 2 and 7, the support bars 30 is located on the rear side of the light exiting surface 10c of the flexible display module 10. The support bars 30 is articulated to the hinge mount 20 along the radial direction of the hinge mount 20, and the support bars 30 is connected to a portion of the flexible display module 10 corresponding to the second folding regions 10a2 such that the support bars 30, when rotating, drives the flexible display module to stretch or fold. The support bars 30 is connected to a portion of the flexible display module 10 corresponding to the second folding regions 10a2 by an adhesive layer.

The support bars 30 are stripe-like. one of the support bars 30 are articulated to the protrusion connection elements 202 of the hinge mount 20. A material for manufacturing the support bars 30 is plastic or metal.

The slide bar 40 is connected to the hinge mount 20, and the slide collar 50 is sleeved on the slide bar 40. Two opposite ends of each of the connection bars 60 are articulated to the slide collar 50 and one of the support bars 30 respectively. The slide collar 50 slides to drive the connection bars 60 to rotate. The connection bars 60 rotate to drive the support bars 30 to rotate to further drive the flexible display module 10 to stretch or fold.

Materials for manufacturing the slide bar 40, the slide collar 50 and the connection bars 6 can be plastic or metal.

It can be understood that the slide bar 40, the slide collar 50 and the connection bars 60 can be replaced with other known driver assembly to drive the support bars 30 to rotate.

The frictional force between the slide collar 50 and the slide bar 40 at the predetermined position of the slide bar 40 is greater than the frictional force between the slide collar 50 and the slide bar 40 at the position other than the predetermined position of the slide bar 40 such that the slide collar 50 stops sliding at the predetermined position of the slide bar 40 and slides at the position other than the predetermined position of the slide bar 40.

It can be understood that a friction damping between the slide collar 50 and the slide bar 40 can be greater such that when no external force is applied to the slide collar 50, the slide collar 50 cam be stay at any position on the slide bar 40 under an effect of the frictional force between the slide collar 50 and the slide bar 40.

Increase of frictional force between the slide collar 50 and the slide bar 40 can be achieved by setting both contact surfaces therebetween as rough surfaces, or only be achieved by increasing roughness of a surface of the slide bar 40 contacting the slide collar 50.

Furthermore, a snap look and a pressure spring can also be disposed on the predetermined position of the slide bar 40 can also. The snap hook is connected to the pressure spring. When the snap hook is snap-engaged with the slide collar 50, the slide collar 50 stop sliding. When an external force is applied to the pressure spring, the snap hook and the slide collar 50 switches from a snap-engagement state to non-contact state and the slide collar 50 slides.

Alternatively, a size of the slide bar 40 can also be adjusted. For example, when the slide bar 40 is cylindrical, a radial size of the slide bar 40 at the predetermined position is greater than a radial size of the slide bar 40 at a position other than the predetermined position such that the slide collar 50 can stay at the predetermined position of the slide bar 40 and slide at the position other than the predetermined position of the slide bar 40.

Alternatively, an interference between the slide bar 40 and the slide collar 50 can also be adjusted. For example, an interference between the slide bar 40 and the slide collar 50 in the predetermined position of the slide bar 40 is greater than an interference between the slide bar 40 and the slide collar 50 in a position of the slide bar 40 other than predetermined position such that the slide collar 50 can stay at the predetermined position of the slide bar 40 and can slide at the position other than the predetermined position of the slide bar 40.

When the predetermined position of the slide bar 40 corresponds to the foldable display device 100 in the stretching state and the completely folding state, the slide collar 50 stays on the position on the slide bar 40.

With reference to FIG. 2, the position-limiting connection bar 80 is connected between the slide bar 40 and the hinge mount 20. When the foldable display device 100 is in the stretching state, the slide collar 50 contacts the position-limiting connection bar 80. The position-limiting connection bar 80 is cylindrical, a radial size of the position-limiting connection bar 80 is greater than a radial size of a hollow chamber in the slide collar 50. When the foldable display device 100 is in the stretching state, the slide collar 50 is limited from further sliding.

A handheld element 110 is further disposed at an end of the slide bar 40 away from the hinge mount 20 such that when the slide bar 40 is secured by holding the handheld element 110, an external force is also applied to the slide collar 50 to drive the slide collar 50 to slide relative to the slide bar 40.

Figure 8:
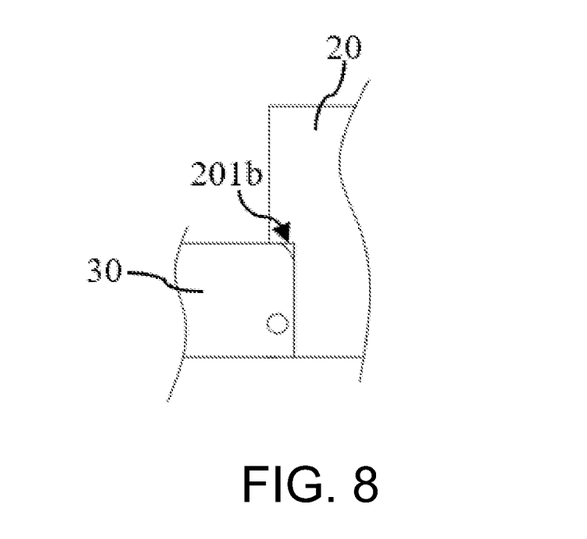
FIG. 8 is a schematic view of the hinge mount articulated to the support bars of the foldable display device shown in FIG. 1 in the stretching state.

With reference to FIGS. 2 and 8, when the foldable display device 100 is in the stretching state, an end of the support bars 30 articulated to the protrusion connection elements 202 abuts the side surface 201*b* of the aperture slots 201. In the meantime, the slide collar 50 contacts the position-limiting connection bar 80 to keep the support bars 30 supporting the flexible display module 10 in the stretching state.

With reference to FIGS. 3 and 7, when the foldable display device 100 is in a completely folding state, an end of the support bars 30 articulated to the protrusion connection elements 202 abuts the bottom surface 201*a* of the aperture slots 201, and the flexible display module 10 folds along the first folding region 10*a*1, the second folding regions 10*a*2, and the third folding regions 10*a*3. The rear surface 10*d* of two of the non-folding regions 10*b* adjacent to two opposite sides of one of the third folding regions 10*a*3 contact each other.

When the foldable display device 100 switches from the stretching state to the folding state, a rotational angle of the support bars 30 is greater than 0 degree and is less than or equal to 90 degrees, for example, a rotational angle is 15 degrees, 25 degrees, 35 degrees, 40 degrees, 50 degrees, 60 degrees, 70 degrees, and 80 degrees. The folding state comprises a completely folding state, and an intervening folding state transiting from the stretching state to the completely folding state.

In particular, when the foldable display device 100 switches from the stretching state to the completely folding state or switches from the completely folding state to the stretching state, a rotational angle of the support bars 30 is equal to 90 degrees.

When it is required to switch the foldable display device 100 from the stretching state to the folding state, a force is applied to the slide collar 50, the slide collar 50 moves along a direction near handheld element 110, the connection bars 60 articulated to the slide collar 50 drive the support bars 30 to rotate to further drive the first folding region 10*a*1, the second folding regions 10*a*2, and the third folding regions 10*a*3 of the flexible display module 10 to deform to fold, and the flexible display module 10 is in the folding state.

The rigid support element 70 is disposed on the rear side of the light exiting surface 10*c* of the flexible display module 10, and is located in the non-folding regions 10*b* such that the rigid support element 70 performs a support function to portions of the flexible display module 10 in the non-folding regions 10*b* when the foldable display device is in the stretching state, and the rigid support element 70 performs support and protective functions to portions of the flexible display module 10 in the non-folding regions 10*b* when the foldable display device is in the folding state.

A shape of the rigid support element 70 is the same as a shape of the non-folding regions 10*b*, and a size of the rigid support element 70 is the same as a size of the non-folding regions 10*b*. Also, when the foldable display device is in the stretching state, an orthographic projection of the rigid support element 70 in the stretching state on the flexible display module 10 completely coincides with portions of the flexible display module 10 corresponding to the non-folding regions 10*b*. A material for manufacturing the rigid support element 70 comprises metal or plastic.

With reference to FIG. 2, the foldable display device 100 further comprises a bonding element 120, the bonding element 120 is bonded to a surface of the rigid support element 70 away from the flexible display module 10 to prevent the bonding element 120 from damages during folding the foldable display device. The bonding element 120 comprises at least one of a printed circuit board and a chip on film.

An orthographic projection of the bonding element 120 on the rigid support element 70 is within the rigid support element 70 such that the rigid support element 70 performs a better protective function to the bonding element 120.

Figure 9:
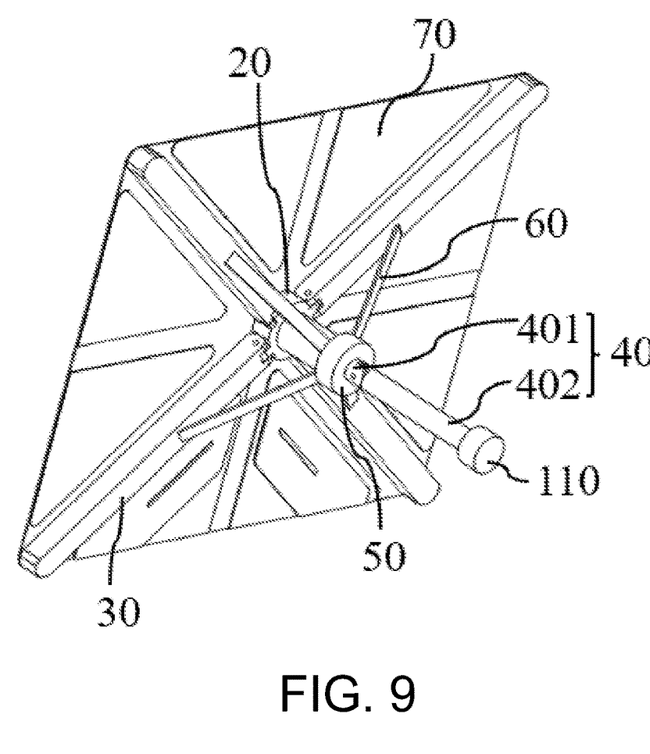
FIG. 9 is a schematic perspective view of a viewing angle of the foldable display device of another embodiment of the present application in the stretching state.
Figure 10:
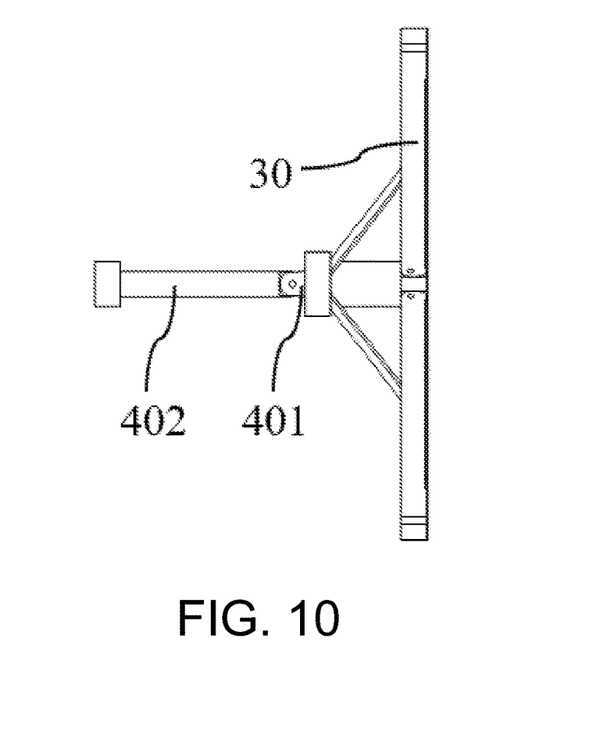
FIG. 10 is a schematic cross-sectional view of the foldable display device in a first stretching state shown in FIG. 9.
Figure 11:
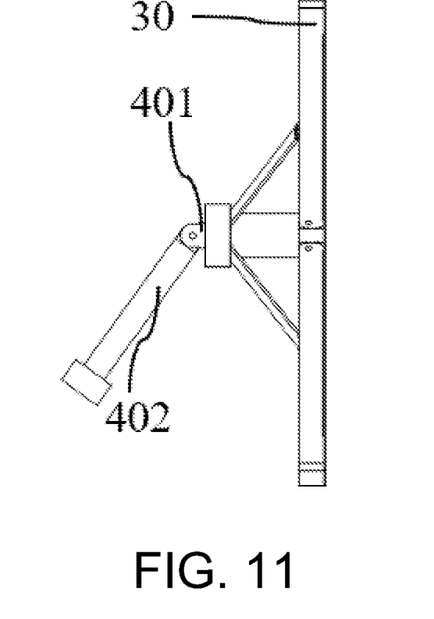
FIG. 11 is a schematic cross-sectional view of the foldable display device shown in FIG. 9 in a second stretching state.
Figure 12:
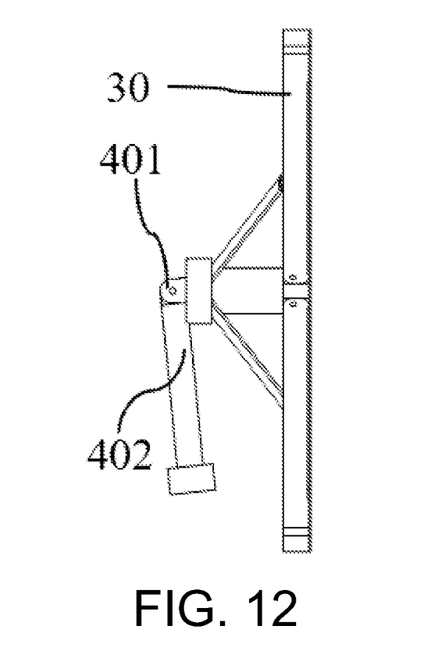
FIG. 12 is a schematic cross-sectional view of the foldable display device shown in FIG. 9 in a third stretching state.

With reference to FIGS. 9, 10, 11, and 12, the foldable display device shown in FIG. 9 is basically similar to the foldable display device shown in FIG. 2, and a difference thereof is that the slide bar 40 comprises a first slide bar 401 and a second slide bar 402. The first slide bar 401 is securely connected to the hinge mount 20 through a position-limiting connection bar 80. The second slide bar 402 is rotatably connected to the first slide bar 401.

When the foldable display device 100 is in the stretching state, the second slide bar 402 rotates relative to the first slide bar 401 to reduce a size of the foldable display device 100 along a direction perpendicular to a display surface.

Figure 13:
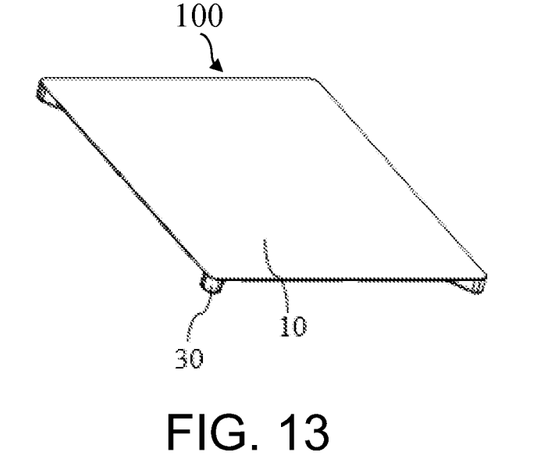
FIG. 13 is a schematic perspective view of a viewing angle of the foldable display device of another embodiment of the present application in the stretching state.
Figure 14:
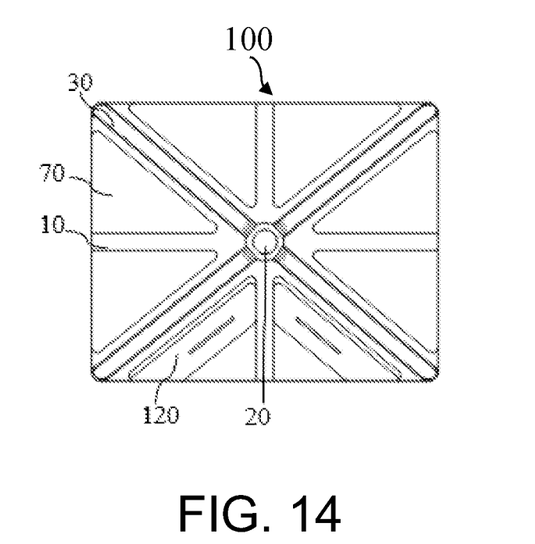
FIG. 14 is a schematic perspective view of another viewing angle of the foldable display device shown in FIG. 13 in the stretching state.
Figure 15:
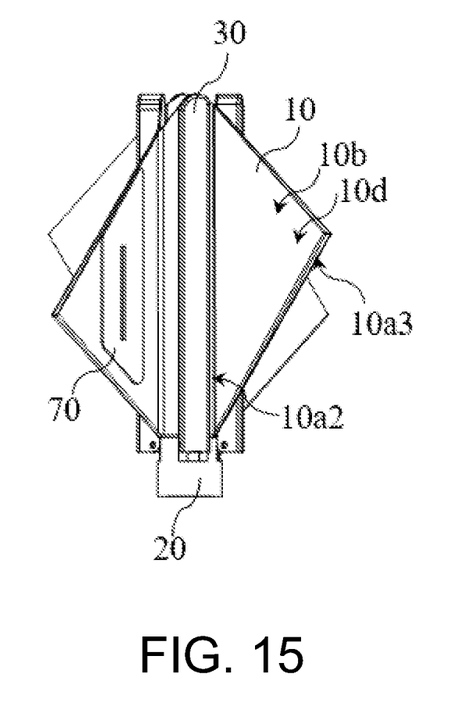
FIG. 15 is a schematic perspective view of the foldable display device shown in FIG. 13 in the completely folding state.

With reference to FIG. 13, FIG. 14, and FIG. 15, the foldable display device 100 is an inner folding display device. The foldable display device 100 comprises a hinge mount 20, a support bars 30, a rigid support element 70, a flexible display module 10, and a bonding element 120.

The foldable display device 100 as shown in FIG. 13 is basically similar to the foldable display device 100 as shown in FIG. 2, and a difference thereof is that in the foldable display device 100 as shown in FIGS. 13 to 15, the aperture slots 201 of the hinge mount 20 are located at an end of the hinge mount 20 near the flexible display module 10.

Structures and connection relationships of the flexible display module 10, the rigid support element 70 and the bonding element 120 of the inner folding display device as shown in FIGS. 13 and 14 are the same as the outer folding display device as shown in FIG. 2. A connection relationship between the hinge mount 20 and the support bars 30 is also the same as the outer folding display device shown in FIG. 2, which is not described repeatedly here.

As shown in FIG. 15, when the flexible display module 10 is in the completely folding state, the flexible display module 10 folds along the first folding region 10a1, the second folding regions 10a2, and the third folding regions 10a3. The light exiting surfaces 10c of two of the non-folding regions 10b adjacent to two opposite sides of one of the third folding regions 10a3 contact each other.

Figure 16:
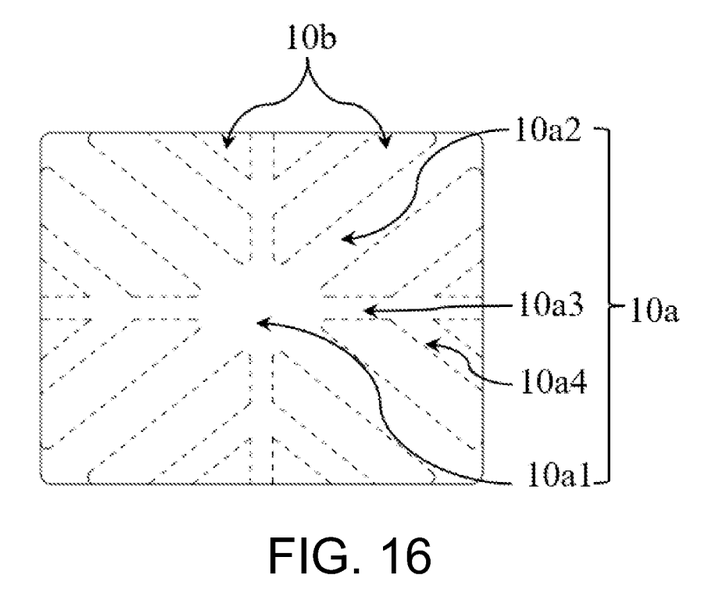
FIG. 16 is a schematic plan view of the flexible display module of the foldable display device of another embodiment of the present application.
Figure 17:
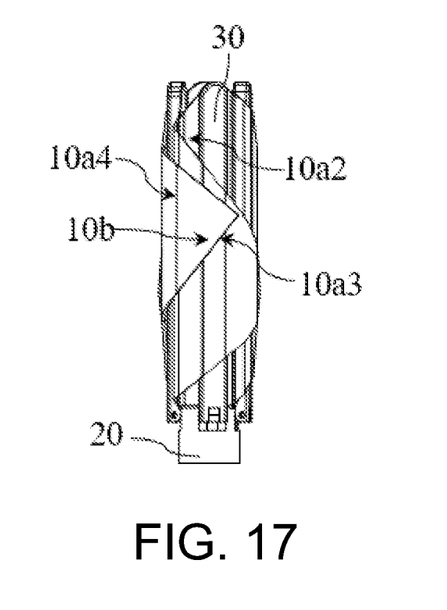
FIG. 17 is a schematic perspective view of the foldable display device shown in FIG. 16 in a completely folding state.
Figure 18:
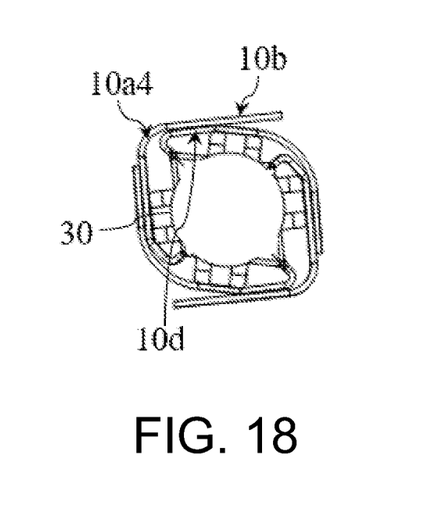
FIG. 18 is a schematic cross-sectional view of the foldable display device shown in FIG. 16 in the completely folding state.

With reference to FIG. 16, FIG. 17, and FIG. 18, the foldable display device shown in FIG. 16 is an inner folding display device, the foldable display device shown in FIG. 16 is basically similar to the foldable display device shown in FIG. 15, and a difference thereof is that the folding regions 10a of the flexible display module 10 further comprise a plurality of fourth folding regions 10a4. One of the fourth folding regions 10a4 extends out from one of the third folding regions 10a3 and is disposed at an interval from the second folding region 10a2. One of the fourth folding regions 10a4 is located between adjacent two of the non-folding regions 10b. Two opposite sides of ach of the third folding regions 10a3 are symmetrically located adjacent to at least two of the fourth folding regions 10a4.

In particular, the two opposite sides of one of the third folding regions 10a3 are symmetrically located adjacent to two of the fourth folding regions 10a4. A side of one of the third folding regions 10a3 is located adjacent to one of the fourth folding regions 10a4. One of the fourth folding regions 10a4 is located between adjacent two of the non-folding regions 10b. One of the fourth folding regions 10a4 is parallel to adjacent one of the second folding regions 10a2.

It can be understood that one side of one of the third folding regions 10a3 can also be located adjacent to two or the fourth folding regions 10a4. The fourth folding regions 10a4 can also be non-parallel to the second folding regions 10a2.

When the foldable display device 100 is in the completely folding state, the flexible display module 10 folds along the first folding region 10a1, the second folding regions 10a2, and the third folding regions 10a3. Portions of the fourth folding regions 10a4 of the flexible display module 10 bend along the radial direction of the hinge mount 20. The light exiting surfaces of two of the non-folding regions 10b adjacent to two opposite sides of one 10c of the third folding regions 10a3 contact each other. The rear surface 10d of one of the non-folding regions 10b adjacent to one of the fourth folding regions 10a4 contacts the rear surface 10d of another of the non-folding regions 10b adjacent to another of the fourth folding regions 10a4. Accordingly, the entire foldable display device 100 folds along the radial direction of the foldable display device 100 such that the size of the foldable display device 100 in the folding state become smaller for convenience of carrying and an area of the expanding display surface increases after the foldable display device stretches.

The foldable display device 100 can also comprise magnetic elements (not shown), the magnetic elements are disposed on the support bars 30 and the rigid support element 70 respectively. When the foldable display device 100 is in the completely folding state, the magnetic elements on the support bars 30 attract the magnetic element on the rigid support element 70 to keep the completely folding state of the foldable display device. The magnetic element can always keep magnetism, and the magnetic element can also have magnetism activated or deactivated by an electronic control.

When the foldable display device 100 is in the completely folding state, a dust plug can also be disposed at an end of the foldable display device 100 away from the hinge mount 20 to protect the light exiting surface 10c of the flexible display module 10.

The description of the above embodiments is only for assisting understanding of the technical solutions of the present application and the core ideas thereof. Those of ordinary skill in the art should understand that they can still modify the technical solutions described in the foregoing embodiments or equivalently replace some of the technical features. These modifications or replacements do not make the essence of the technical solutions depart from a range of the technical solutions of the embodiments of the present application.

What is claimed is:

1. A foldable display device, wherein the foldable display device comprises:
    a flexible display module, wherein the flexible display module comprises a folding region and a plurality of non-folding regions, the folding region comprises a first folding region, a plurality of second folding regions and a plurality of third folding regions, the second folding regions are connected to one of the first folding region along a radial direction of one of the first folding region, the third folding regions is located between adjacent two of the second folding regions and is connected to one of the first folding region, and each of the non-folding regions is disposed between one of the second folding regions and one of the third folding regions that are adjacent to each other;
    a hinge mount located on a rear side of a light exiting surface of the flexible display module and connected to a portion of the flexible display module corresponding to the first folding region; and
    a plurality of support bars located on the rear side of the light exiting surface of the flexible display module, articulated on the hinge mount along a radial direction of the hinge mount, and connected to portions of the flexible display module corresponding to the second folding regions, wherein the support bars are configured to rotate to drive the flexible display module to stretch or fold;
    wherein the flexible display module comprises:
        a flexible display panel; and
        a protective cover lid located on a light exiting side of the flexible display panel, wherein the protective cover lid comprises recesses located in the folding region.

2. The foldable display device according to claim 1, wherein the recesses are defined in a surface of the protective cover lid away from the flexible display panel, and the flexible display module further comprises:
 a filling layer, wherein at least a portion of the filling layer is filled in the recesses of the protective cover lid, and an elastic modulus of the filling layer is less than an elastic modulus of the protective cover lid.

3. The foldable display device according to claim 2, wherein a ratio of a refractive index of the filling layer to a refractive index of the protective cover lid is greater than or equal to 0.9 and is less than or equal to 1.1.

4. The foldable display device according to claim 1, a shape of the recesses is the same as a shape of the first folding region, a shape of the second folding regions, and a shape of the third folding regions.

5. The foldable display device according to claim 1, wherein the foldable display device further comprises:
 a rigid support element disposed on the rear side of the light exiting surface of the flexible display module and is located in the non-folding regions.

6. The foldable display device according to claim 5, wherein the foldable display device further comprises a bonding element, when the foldable display device is in a stretching state, and the bonding element is bonded to a surface of the rigid support element away from the flexible display module.

7. The foldable display device according to claim 6, wherein when the foldable display device is in the stretching state, an orthogonal projection of the bonding element on the rigid support element is within the rigid support element.

8. The foldable display device according to claim 1, wherein the first folding region is located at a center position of the flexible display module, one of the third folding regions is disposed in adjacent two of the second folding regions, and adjacent two of the second folding regions are axial-symmetrically disposed relative to the third folding regions.

9. The foldable display device according to claim 1, wherein when the foldable display device switches from a stretching state to a folding state, a rotational angle of the support bars is greater than 0 degree and is less than or equal to 90 degrees.

10. The foldable display device according to claim 1, wherein the hinge mount comprises:
 a plurality of aperture slots located at an end of the hinge mount and are defined along a radial direction of the hinge mount, wherein each of the aperture slots comprises a bottom surface and a side surface connected to the bottom surface, and the side surface is disposed opposite to an aperture of the aperture slot; and
 a plurality of protrusion connection elements disposed on the bottom surfaces of the aperture slots and are disposed opposite to the side surfaces at intervals, wherein the protrusion connection elements is articulated to the support bars;
 wherein when the foldable display device is in a stretching state, an end of the support bar articulated to the protrusion connection element abuts the side surface of the aperture slot;
 wherein when the foldable display device is in a completely folding state, the end of the support bar articulated to the protrusion connection element abuts the bottom surface of the aperture slot.

11. The foldable display device according to claim 10, wherein the side surface extends along a radial direction of the hinge mount, and the side surface is perpendicular to the bottom surface.

12. The foldable display device according to claim 10, wherein the foldable display device is an outer folding display device, and the aperture slots are located at an end of the hinge mount away from the flexible display module.

13. The foldable display device according to claim 12, wherein the foldable display device further comprises:
 a slide bar connected to the hinge mount;
 a slide collar sleeved on the slide bar; and
 a plurality of connection bars, two opposite ends of the connection bars are articulated to the slide collar and the support bars respectively.

14. The foldable display device according to claim 13, wherein the slide bar comprises:
 a first slide bar securely connected to the hinge mount; and
 a second slide bar rotatably connected to the first slide bar.

15. The foldable display device according to claim 13, wherein a frictional force between the slide collar and the slide bar at a predetermined position of the slide bar, is greater than a frictional force between the slide collar and the slide bar at a position other than the predetermined position of the slide bar.

16. The foldable display device according to claim 10, wherein the foldable display device is an inner folding display device, and the aperture slots are located at an end of the hinge mount near the flexible display module.

17. The foldable display device according to claim 1, wherein the flexible display module comprises the light exiting surface and a rear surface disposed opposite to the light exiting surface, when the flexible display module is in a completely folding state, the flexible display module folds along the first folding region, the second folding regions, and the third folding regions; and
 the foldable display device is an inner folding display device, and the light exiting surfaces of two of the non-folding regions adjacent to two opposite sides of one of the third folding regions contact each other.

18. The foldable display device according to claim 17, wherein the folding region further comprises a plurality of fourth folding regions, one of the fourth folding regions extends from the third folding regions and is disposed at an interval from the second folding regions, one of the fourth folding regions is located between adjacent two of the non-folding regions, two opposite sides of each of the third folding regions are symmetrically located adjacent to at least two of the fourth folding regions, when the flexible display module is in the completely folding state, the fourth folding regions of the flexible display module fold along the radial direction of the hinge mount; and
 the light exiting surfaces of two of the non-folding regions adjacent to two opposite sides of one of the third folding regions contact each other, and contact a rear surface of one of the non-folding regions adjacent to one of the fourth folding regions and contact a rear surface of another of the non-folding regions adjacent to another of the fourth folding regions.

19. The foldable display device according to claim 1, wherein the flexible display module comprises a light exiting surface and a rear surface disposed opposite to the light exiting surface, when the flexible display module is in a completely folding state, the flexible display module folds along the first folding region, the second folding regions, and the third folding regions; and the foldable display device is an outer folding display device, rear surfaces of two of the non-folding regions adjacent to two opposite sides of one of the third folding regions contact each other.

20. A foldable display device, wherein the foldable display device comprises:
- a flexible display module, wherein the flexible display module comprises a folding region and a plurality of non-folding regions, the folding region comprises a first folding region, a plurality of second folding regions and a plurality of third folding regions, the second folding regions are connected to one of the first folding region along a radial direction of one of the first folding region, the third folding regions is located between adjacent two of the second folding regions and is connected to one of the first folding region, and each of the non-folding regions is disposed between one of the second folding regions and one of the third folding regions that are adjacent to each other;
- a hinge mount located on a rear side of a light exiting surface of the flexible display module and connected to a portion of the flexible display module corresponding to the first folding region; and
- a plurality of support bars located on the rear side of the light exiting surface of the flexible display module, articulated on the hinge mount along a radial direction of the hinge mount, and connected to portions of the flexible display module corresponding to the second folding regions, wherein the support bars are configured to rotate to drive the flexible display module to stretch or fold;

wherein the hinge mount comprises:
- a plurality of aperture slots located at an end of the hinge mount and are defined along a radial direction of the hinge mount, wherein each of the aperture slots comprises a bottom surface and a side surface connected to the bottom surface, and the side surface is disposed opposite to an aperture of the aperture slot; and
- a plurality of protrusion connection elements disposed on the bottom surfaces of the aperture slots and are disposed opposite to the side surfaces at intervals, wherein the protrusion connection elements is articulated to the support bars;

wherein when the foldable display device is in a stretching state, an end of the support bar articulated to the protrusion connection element abuts the side surface of the aperture slot;

wherein when the foldable display device is in a completely folding state, the end of the support bar articulated to the protrusion connection element abuts the bottom surface of the aperture slot.

* * * * *